United States Patent
Katagiri

(10) Patent No.: US 7,325,218 B2
(45) Date of Patent: Jan. 29, 2008

(54) WIRING METHOD, PROGRAM, AND APPARATUS

(75) Inventor: Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 397 days.

(21) Appl. No.: 11/062,617

(22) Filed: Feb. 22, 2005

(65) Prior Publication Data

US 2006/0117289 A1   Jun. 1, 2006

(30) Foreign Application Priority Data

Nov. 29, 2004   (JP) .............................. 2004-343339

(51) Int. Cl.
*G06F 17/50* (2006.01)
*G06F 9/45* (2006.01)

(52) U.S. Cl. ............................ 716/13; 716/5

(58) Field of Classification Search ............ 716/4, 716/5, 12–14
See application file for complete search history.

(56) References Cited

U.S. PATENT DOCUMENTS

| | | | | |
|---|---|---|---|---|
| 6,058,256 | A * | 5/2000 | Mellen et al. ................. | 716/12 |
| 6,080,206 | A | 6/2000 | Tadokoro et al. | |
| 6,968,521 | B2 * | 11/2005 | Ushiyama et al. ............. | 716/5 |
| 2004/0015806 | A1 * | 1/2004 | Frank et al. .................. | 716/13 |
| 2004/0103386 | A1 * | 5/2004 | Becer et al. .................. | 716/13 |
| 2005/0132309 | A1 * | 6/2005 | Saxena et al. ................ | 716/4 |
| 2006/0026539 | A1 * | 2/2006 | Tetelbaum et al. ............ | 716/2 |
| 2007/0079274 | A1 * | 4/2007 | Tetelbaum .................... | 716/12 |

FOREIGN PATENT DOCUMENTS

| | | |
|---|---|---|
| JP | 5-160375 | 6/1993 |
| JP | 5-181936 | 7/1993 |
| JP | 5-243383 | 9/1993 |
| JP | 6-124321 | 5/1994 |
| JP | 9-147009 | 6/1997 |
| JP | 10-189746 | 7/1998 |
| JP | 2003-303217 | 10/2003 |

* cited by examiner

*Primary Examiner*—Jack Chiang
*Assistant Examiner*—Magid Y. Dimyan
(74) *Attorney, Agent, or Firm*—Staas & Halsey LLP

(57) ABSTRACT

A problem is efficiently solved by giving a proper adjacent spacing condition only to nets having such a problem that a wiring delay and crosstalks are caused. A wiring processing unit executes a wiring process by giving a first adjacent spacing condition that does not become a wiring violation on the basis of a net list of a semiconductor circuit. A noise analyzing unit extracts error nets in which noise errors have occurred by a noise analysis of a wiring formed by the wiring processing unit. A wiring condition changing unit gives a second adjacent spacing condition for eliminating the noise errors to the error nets extracted by the noise analyzing unit, gives the first adjacent spacing condition to the nets other than the error nets, and allows the wiring process to be executed again on the basis of the net list.

9 Claims, 6 Drawing Sheets

PRIOR ART

| NET NAME | ADJACENT SPACING CONDITION |
|---|---|
| net1 | 1.0μm |
| net2 | 2grid |
| net3 | 0.5μm |

| NET TYPE | ADJACENT SPACING CONDITION |
|---|---|
| kind1 | 1.0μm |
| kind2 | 2grid |
| kind3 | 0.5μm |

| NET NAME | WIRING LAYER | ADJACENT SPACING CONDITION |
|---|---|---|
| name1 | MTL1 | 1grid |
| name1 | MTL2 | 2grid |
| name2 | MTL1 | 0.5μm |
| name2 | MTL2 | 1.0μm |

WIRING METHOD, PROGRAM, AND APPARATUS

This application is a priority based on prior application No. JP 2004-343339, filed on Nov. 29, 2004, in Japan.

BACKGROUND OF THE INVENTION

1. Field of the Invention

The invention relates to wiring method, program, and apparatus in a layout design of an LSI and, more particularly, to wiring method, program, and apparatus which take crosstalks and a wiring delay into consideration.

2. Description of the Related Arts

In recent years, with respect to an LSI designing system, an influence of a wiring delay is larger than that of a gate delay due to micro miniaturization of a transistor size. An adjacent load capacity can be mentioned as one of causes of the wiring delay. An influence of noises caused by crosstalks is also large and the adjacent load capacity can be also mentioned as one of causes of the noises. Therefore, a wiring technique to reduce the adjacent load capacity at the time of automatic wiring is demanded. In the conventional automatic wiring, when a certain net is automatically wired on the basis of a net list, a minimum adjacent spacing condition which does not become a wiring violation is given and the wiring is performed. Even if a load condition to reduce the adjacent load capacity is given, it is given to all nets and the nets are automatically wired.

Refer to JP-A-5-181936, JP-A-6-124321, JP-A-5-160375, JP-A-5-243383, JP-A-9-147009, JP-A-10-189746, and JP-A-2003-303217.

However, if the minimum adjacent spacing condition which does not become the wiring violation is given and the wiring is performed in the conventional automatic wiring as mentioned above, the adjacent load capacity is added with respect to an important path and the problems of the increase in wiring delay and the increase in crosstalk noises are caused. Even if the automatic wiring is executed by using the load condition for the adjacent capacity, since it is executed for all of the nets as targets, such a problem that the apparatus enters the state where it is difficult to complete the wiring due to a lack of channels in terms of a relation with an integration degree.

SUMMARY OF THE INVENTION

According to the invention, wiring method, program, and apparatus which can efficiently solve the problem by giving a proper adjacent spacing con dition only to nets having such a problem that a wiring delay or crosstalks are caused are provided.

The invention provides a wiring method of designing a semiconductor circuit such as an LSI or the like. The wiring method of the invention comprises:

a wiring processing step wherein a first adjacent spacing condition which does not become a wiring violation is given and a wiring process is executed on the basis of a net list of the semiconductor circuit;

a noise analyzing step wherein error nets in which noise errors have occurred are extracted by analyzing noises of a wiring formed in the wiring processing step;

a wiring condition changing step wherein a second adjacent spacing condition for eliminating the noise errors of the error nets extracted in the noise analyzing step is set; and a re-wiring processing step wherein the second adjacent spacing condition is given to the error nets, the first adjacent spacing condition is given to nets other than the error nets, and the wiring process is executed again on the basis of the net list.

In the wiring condition changing step, a parameter file in which the second adjacent spacing condition for eliminating the noise errors of the error nets has been set every net name is formed, and in the re-wiring processing step, the second adjacent spacing condition in the parameter file is given to the error nets and the wiring process is executed again.

In the wiring condition changing step, a parameter file in which the second adjacent spacing condition for eliminating the noise errors of the error nets has been set in accordance with a net type is formed, and similarly, in the re-wiring processing step, the second adjacent spacing condition in the parameter file is given to the error nets and the wiring process is executed again.

Further, in the wiring condition changing step, a parameter file in which the second adjacent spacing condition for eliminating the noise errors of the error nets has been set in accordance with a wiring layer is formed, and similarly, in the re-wiring processing step, the second adjacent spacing condition in the parameter file is given to the error nets and the wiring process is executed again.

In the wiring condition changing step, a parameter file in which a distance between the nets or the number of grids between the nets has been set as a second adjacent spacing condition of the error nets is formed. In the wiring processing step, a minimum adjacent spacing condition is given as a first adjacent spacing condition and the wiring process is executed.

The invention provides a wiring program which is executed by a computer. The wiring program of the invention allows the computer to execute:

a wiring processing step wherein a first adjacent spacing condition which does not become a wiring violation is given and a wiring process is executed on the basis of a net list of a semiconductor circuit;

a noise analyzing step wherein error nets in which noise errors have occurred are extracted by analyzing noises of a wiring formed in the wiring processing step;

a wiring condition changing step wherein a second adjacent spacing condition for eliminating the noise errors of the error nets extracted in the noise analyzing step is set; and a re-wiring processing step wherein the second adjacent spacing condition is given to the error nets, the first adjacent spacing condition is given to nets other than the error nets, and the wiring process is executed again on the basis of the net list.

The invention provides a wiring apparatus for designing a semiconductor circuit such as an LSI or the like. The wiring apparatus of the invention comprises:

a wiring processing unit which executes a wiring process by giving a first adjacent spacing condition that does not become a wiring violation on the basis of a net list of the semiconductor circuit;

a noise analyzing unit which extracts error nets in which noise errors have occurred by analyzing noises of a wiring formed by the wiring processing unit; and a wiring condition changing unit which gives a second adjacent spacing condition for eliminating the noise errors to the error nets and allows the wiring processing unit to execute the wiring process again on the basis of the net list in the state where the first adjacent spacing condition has been given to nets other than the error nets.

Details of the program and the wiring apparatus according to the invention are fundamentally the same as those of the wiring method of the invention.

According to the invention, after the minimum adjacent spacing condition was given to all of the nets and the wiring process was executed, the noises are analyzed, and the nets which do not satisfy a noise restriction that takes the crosstalks or the wiring delay into consideration are extracted as error nets in which the noise errors have occurred. On the basis of the error nets, a new adjacent spacing condition for widening a wiring interval is set as a parameter for eliminating the noise error, the wiring process is executed again, and the noise error can be eliminated. According to the invention, at the stage of an upstream logic design, it is presumed that a designing process which takes the adjacent load capacity (coupling capacity) into consideration has been executed. The wiring process in which the adjacent spacing condition has been changed is executed again to the error nets, as a target, in which the noise error still occurs by the noise analysis as a result of the wiring process, so that the wiring process can be efficiently and successfully completed in a short time.

In the case where the designing process which takes the adjacent load capacity (coupling capacity) into consideration is executed at the stage of an upstream logic design as mentioned above, the number of error nets obtained by the noise analysis after the wiring process is less than, for example, 100. According to the invention, by giving the adjacent spacing condition for eliminating the noise errors to the error nets and executing the wiring process again, the errors of the target nets are successively eliminated and the automatic wiring can be efficiently and successfully completed in a short time.

The parameter of the adjacent spacing condition which is given to the error nets is formed in correspondence to the net name, the net type, or the wiring layer. For example, with respect to the net type, since a clock net is generally most critical, the parameter of the adjacent spacing condition in the case where the error nets occurred with respect to it is preferentially set, thereby rescuing. As for the parameter of the adjacent spacing condition corresponding to the wiring layer, since the first and second layers are cell layers and a possibility of existence of a long wiring which causes the crosstalks is low, an external parameter of the adjacent condition is set every layer with respect to the layers where the longer nets are wired and the nets in which the noise errors have occurred can be eliminated.

The above and other objects, features, and advantages of the present invention will become more apparent from the following detailed description with reference to the drawings.

BRIEF DESCRIPTION OF THE DRAWINGS

FIGS. 4A to 4C are explanatory diagrams of parameter files in FIG. 2;

DETAILED DESCRIPTION OF THE PREFERRED EMBODIMENT

Figure 1:
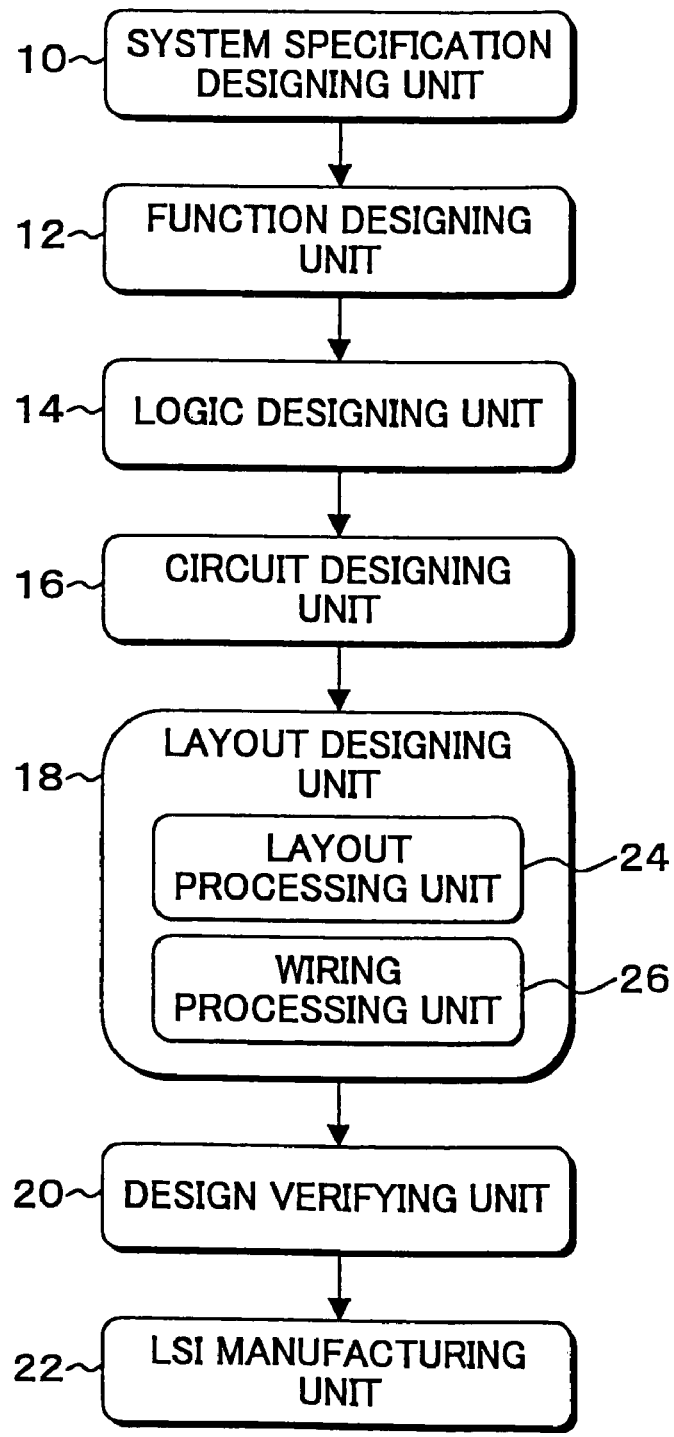
FIG. 1 is a block diagram of a whole construction of an LSI designing system.

FIG. 1 is a block diagram of a whole construction of an LSI designing system to which a wiring method of the invention is applied. In FIG. 1, the LSI designing system comprises: a system specification designing unit 10; a function designing unit 12; a logic designing unit 14; a circuit designing unit 16; a layout designing unit 18; a design verifying unit 20; and an LSI manufacturing unit 22. Among them, a layout processing unit 24 and a wiring processing unit 26 are provided for the layout designing unit 18. The wiring method of the invention is applied to the wiring processing unit 26. The system specification designing unit 10 determines into which functional blocks the whole system is divided and how it operates in order to realize a target system specification of an LSI. An operation simulator or a system simulator is used to examine validity of a design result.

The function designing unit 12 makes a design at a register transfer level (RT level) for deciding an internal structure and the operation of a functional block. A function simulator is used to verify the design result. The logic designing unit 14 designs a logic circuit at a gate level. A logic simulator, a timing simulator, or the like is used to confirm the operation. The circuit designing unit 16 designs a transistor circuit. A circuit simulator is used to examine characteristics of the designed circuit. The layout designing unit 18 executes a process for converting a circuit diagram into a layout wiring of a device having a physical shape and dimensions and a layout, a wiring program, and the like corresponding to an automatic design are used.

The layout processing unit 24 in the layout designing unit 18 decides a shape of a device such as transistor, cell, or the like having actual physical dimensions and its layout position from logical information such as logic circuit or transistor circuit. The wiring processing unit 26 provided for the layout designing unit 18 decides a design among the cells arranged by the layout processing unit 24 so as to satisfy a design and various restricting conditions. A method of dividing the line connection into two stages of global wiring and detailed wiring is ordinarily used as a wiring method. According to the global wiring, each net is divided into specific wiring areas and the wirings are allocated, and which wiring area is used while avoiding a direct jam is determined. According to the detailed wiring, actual wiring of each net is made and the nets between two points or among multi-points are sequentially wired one by one at the shortest distance. A labyrinth method, a line segment searching method, a channel wiring method, or the like is used as a wiring algorithm.

The design verifying unit 20 executes the following processes: a design rule check (DRC) to examine rule violation of the design dimensions with respect to the designed layout; a forming check to examine a line extracting and forming algorithm for forming line forming information from the layout; an electric rule check to examine dimension requesting characteristics of the transistor and the presence or absence of a short-circuit of a power wiring; and the like. When the processes of the design verifying unit 20 are finished, mask data is formed and transferred to the LSI manufacturing unit 22 and an LSI is manufactured.

The invention is applied to the wiring processing unit 26 in the layout designing unit 18. When the wiring process is executed on the basis of a net list, first, the minimum adjacent spacing condition is given as a first adjacent spacing condition and the wiring process is executed. With respect to a result of the wiring process, noises are analyzed. Error nets in which noise errors have occurred are extracted by the noise analysis. A second adjacent spacing condition for eliminating the noise errors is set to the error nets, the wiring process is executed again, and the noise analysis and the re-wiring process due to the change in the adjacent spacing condition to the error nets are repeated until the noise errors are eliminated.

Figure 2:
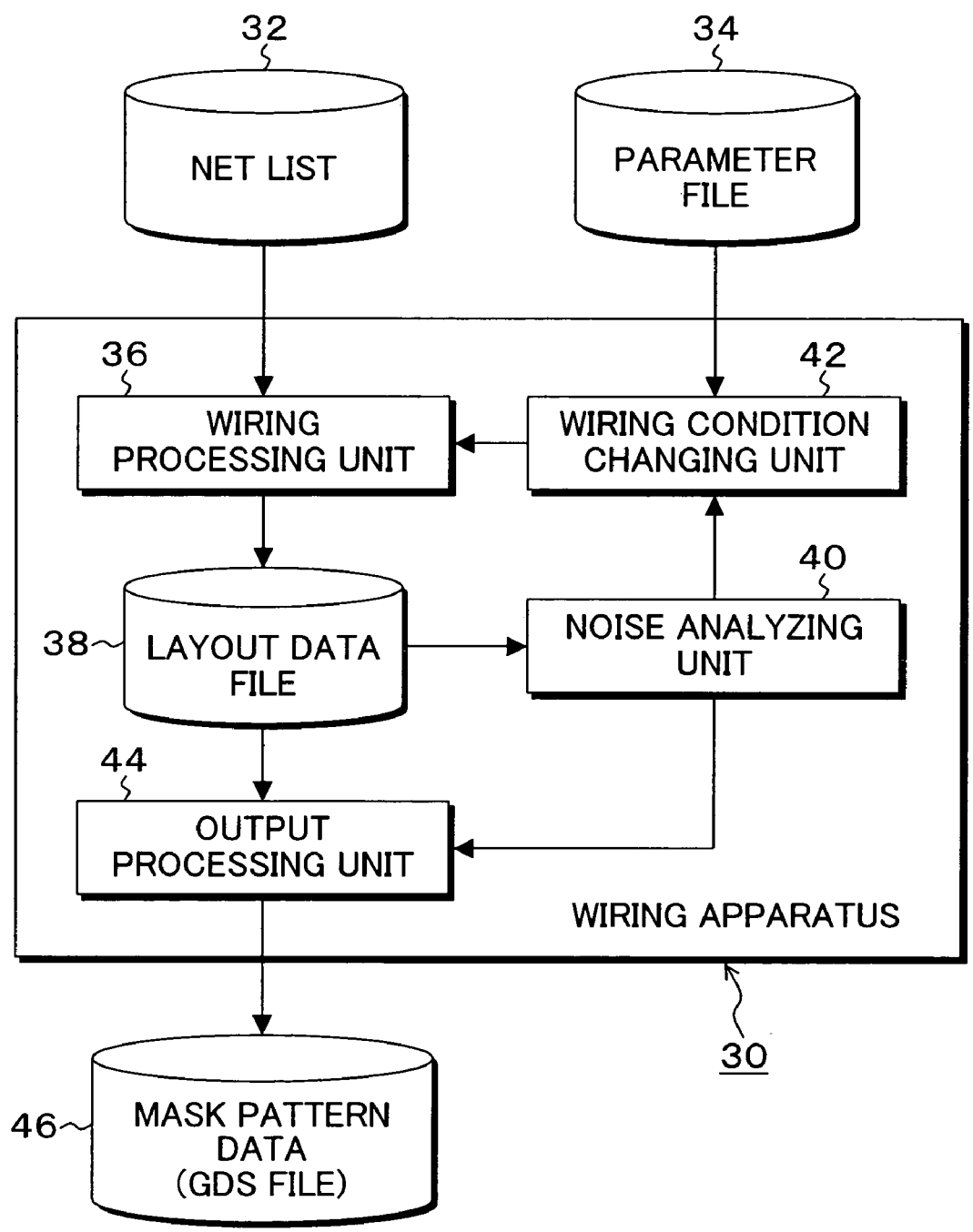
FIG. 2 is a block diagram of a functional construction of a wiring apparatus according to the invention.

FIG. 2 is a block diagram of a functional construction of a wiring apparatus according to the invention. In FIG. 2, a net list 32 is provided for a wiring apparatus 30 of the invention. Net list data obtained after the design was finished in the circuit designing unit 16 as shown in FIG. 1 has been stored in the net list 32. A parameter file 34 is provided for the wiring apparatus 30. As will be clearly explained hereinafter, a parameter to widen an interval between the error nets as an adjacent spacing condition which is used in a re-wiring process of the error nets extracted by the noise analysis of the result of the wiring process of the invention, that is, as a second spacing condition is formed and stored in the parameter file 34.

The wiring apparatus 30 comprises: a wiring processing unit 36; a layout data file 38; a noise analyzing unit 40; a wiring condition changing unit 42; and an output processing unit 44. Layout design data obtained after completion of the process in the wiring apparatus 30 is outputted as mask pattern data 46 after completion of the design verification. The wiring processing unit 36 provided for the wiring apparatus 30 gives the minimum adjacent spacing condition (first adjacent spacing condition) which does not become the wiring violation on the basis of the net list 32 and executes the wiring process. The wiring result by the wiring processing unit 36 is temporarily stored in the layout data file 38.

The noise analyzing unit 40 executes the noise analysis of the wiring result in the layout data file 38 as a target. The error nets in which the noise errors have occurred are extracted by the noise analysis. As a specific noise analysis by the noise analyzing unit 40, for example, costs are calculated by the following equation (line width×length)=(costs)

with respect to the net in which the crosstalks are caused. If the calculated costs of this net exceeds predetermined crosstalk costs which have been determined as a noise restricting condition, this net is determined to be the error net. That is, in the design of the LSI, the error including the crosstalks is caused by the capacity which is coupled between the adjacent wirings, that is, the adjacent load capacity (coupling capacity). When the crosstalks occur, a change is caused in a signal delay or they become a cause of an illegal transition of the logic and an object of performance of a chip cannot be accomplished. Therefore, the net in this case is determined to be the error net and extracted.

The wiring condition changing unit 42 forms an adjacent spacing condition (second adjacent spacing condition) for eliminating the noise errors of the error nets extracted by the noise analyzing unit 40, stores it into the parameter file 34, and thereafter, gives the adjacent spacing condition in the parameter file 34 to the error nets. With respect to the nets other than the error nets, the wiring condition changing unit 42 gives the minimum adjacent spacing condition which was used first and allows the wiring processing unit 36 to execute the wiring process again under such a condition. The result of the wiring process executed under the adjacent spacing condition formed with respect to the error nets by the wiring condition changing unit 42 is stored into the layout data file 38. After that, it is analyzed by the noise analyzing unit 40 again. If the noise restriction is satisfied, it is determined that the wiring process is successful, thereby instructing the output processing unit 44 to output the wiring result.

If the error nets in which the noise errors are not eliminated still remain by the noise re-analysis of the wiring result, the adjacent spacing condition (second adjacent spacing condition) necessary to eliminate the noise errors of the residual error nets is further formed in the wiring condition changing unit 42. This parameter is stored into the parameter file 34. After that, the adjacent spacing condition in the parameter file 34 is given to the residual error nets. With respect to the nets other than the error nets, the wiring process of the wiring processing unit 36 is again repeated in the state where the first adjacent spacing condition has been given. In the adjacent spacing condition for eliminating the noise errors of the error nets at the time of repeating the wiring process in the wiring condition changing unit 42, the parameter is changed so as to widen the wiring interval each time the wiring process is executed. However, the maximum value of the wiring interval is set and when the wiring interval reaches the maximum value due to the change in the adjacent spacing condition, the adjacent spacing condition cannot be changed any more. Therefore, it is regarded that the wiring process failed, the designing process is returned to the upstream side, and the designing process is repeated again.

With respect to the wiring process according to the invention, naturally, it is presumed that the designing process which takes the adjacent load capacity (coupling capacity) into consideration is executed in the designing process of the upstream side such as function designing unit 12, logic designing unit 14, or circuit designing unit 16 shown in FIG. 1. Even is such a designing process on the upstream side is executed, errors still remain. Therefore, the error nets are extracted by the error analysis in the alternation of the wiring process, the adjacent spacing condition for the error nets is lightened, thereby allowing the wiring process to be successfully completed.

Figure 3:
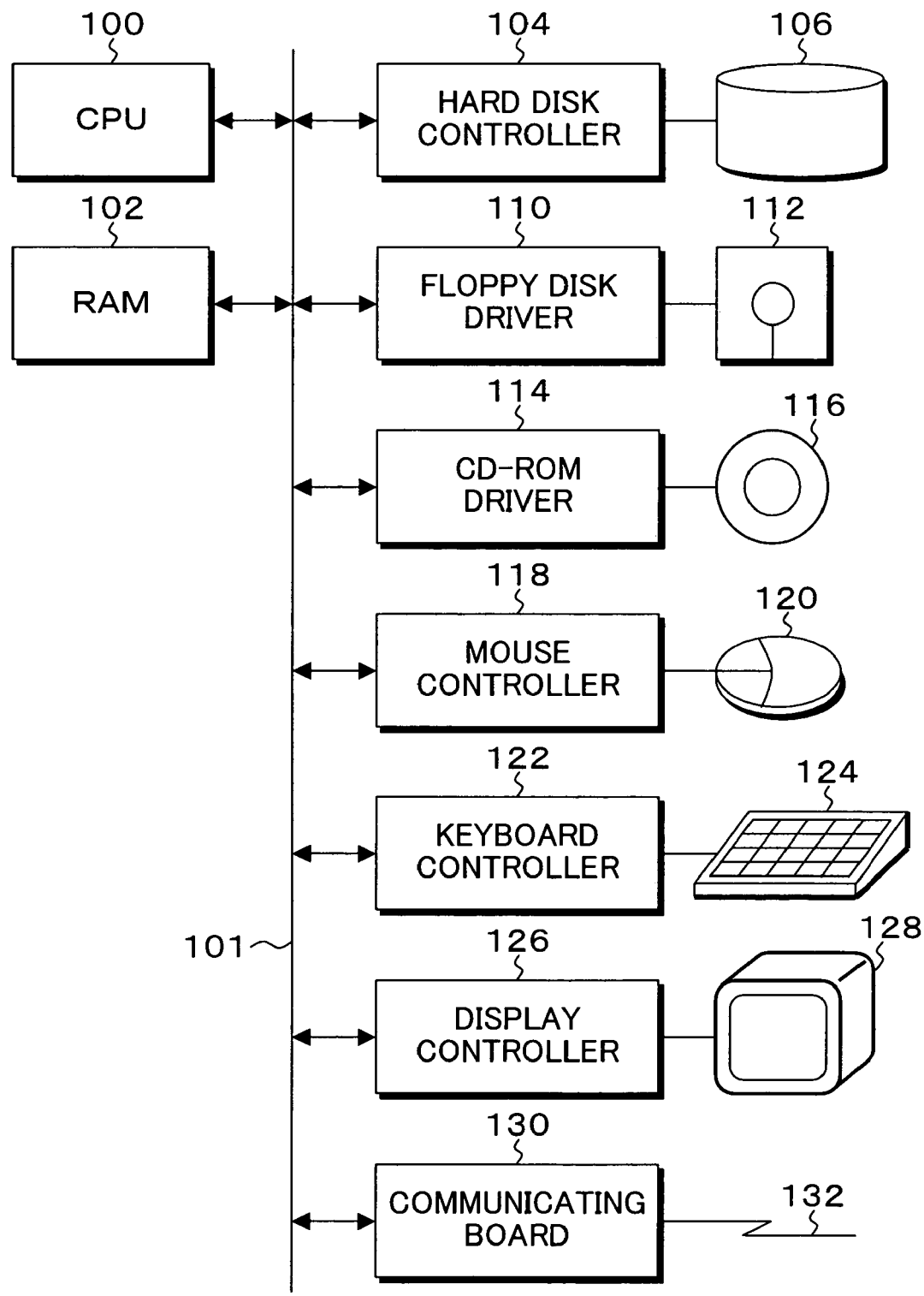
FIG. 3 is an explanatory diagram of a hardware environment of a computer to which the wiring apparatus of FIG. 2 is applied.

The wiring apparatus 30 in FIG. 2 is realized by, for example, hardware resources of a computer as shown in FIG. 3. In the computer in FIG. 3, a RAM 102, a hard disk controller (software) 104, a floppy disk driver (software) 110, a CD-ROM driver (software) 114, a mouse controller 118, a keyboard controller 122, a display controller 126, and a communicating board 130 are connected to a bus 101 of a CPU 100. A hard disk drive 106 is connected to the hard disk controller 104. Programs to execute the wiring process of the invention have been loaded in the hard disk controller 104. When the computer is activated, the necessary program is called from the hard disk drive 106, developed into the RAM 102, and executed by the CPU 100.

A floppy disk drive (hardware) 112 is connected to the floppy disk driver 110 and data can be written and read out into/from a floppy disk (registered trademark). A CD drive (hardware) 116 is connected to the CD-ROM driver 114 and data or programs stored in a CD can be read out. The mouse controller 118 transfers the inputting operation of a mouse 120 to the CPU 100. The keyboard controller 122 transfers the inputting operation of a keyboard 124 to the CPU 100. The display controller 126 allows a display unit 128 to display data. The communicating board 130 communicates with an external apparatus via a network by using a communicating line 132 including a wireless manner.

FIGS. 4A to 4C are explanatory diagrams of parameter information which is stored into the parameter file 34. FIG. 4A shows a net name parameter file 48. The adjacent spacing condition for eliminating the noise errors is formed and registered with respect to net names net1, net2, net3, . . . of the error nets extracted by the noise analysis. The adjacent spacing condition is a condition in which the minimum adjacent spacing condition (first adjacent spacing condition) which is used as a default has been lightened. A distance (μm) between the nets or the number of grids (grid) between the nets is used as a specific parameter of the adjacent spacing condition. In the discrimination of the error nets in the invention, the error nets due to the crosstalks are discriminated. With respect to the crosstalks, the nets locating on both sides of the net in which a signal which becomes a cause of the noises flows become the error nets in which the noise errors occur.

In the net name parameter file 48 in FIG. 4A, the parameter as an adjacent spacing condition for eliminating the noise errors is formed and registered every net name of the error nets in which the noise errors due to the crosstalks have occurred. This parameter is used at the time of executing the wiring process again.

FIG. 4B is an explanatory diagram of a net type parameter file 50. In the net type parameter file 50, the parameter of the adjacent spacing condition for eliminating the noise errors of the error nets is registered as a distance (μm) between the nets or the number of grids (grid) between the nets in correspondence to the net type. As a net type registered in the net type parameter file 50, for example, it can be classified into a clock net and the other nets. Generally, since the clock net is the most critical net, the parameter setting for eliminating the noise errors in the case where the clock net is determined to be the error net is preferentially made. With respect to the nets other than the clock net, the adjacent spacing condition is set at a low priority.

That is, when the clock net is the error net, as an adjacent spacing condition, the sufficient value of the distance between the nets or the number of grids between the nets is formed and set as a parameter and a large value is used as an adjacent spacing parameter condition for the clock net. On the other hand, with respect to the error nets other than the clock net, the parameter of a small value is used as an adjacent spacing condition, even if the value of the parameter for eliminating the noises of the clock net is increased, the apparatus is prevented from entering the state where it is difficult to complete the wiring due to the lack of channels in view of the relation with the correction activation of the whole chip in the re-writing process.

FIG. 4C is an explanatory diagram of a wiring layer parameter file 52. The wiring layer parameter file 52 is constructed by the net name, the wiring layer, and the adjacent spacing condition. Usually, with respect to the wiring layer of the LSI, since the first and second layers are cell layers and a possibility of the existence of the long wiring which causes the crosstalks is low, with respect to the other wiring layers in which the long wirings exist, the wiring layer parameter file 52 as shown in FIG. 4C is provided and the parameter as an adjacent spacing condition for eliminating the net errors is formed and registered in dependence on the net name and the wiring layer.

In the net name parameter file 48, the net type parameter file 50, and the wiring layer parameter file 52 in FIGS. 4A to 4C, the distance between the nets or the number of grids between the nets as an adjacent spacing condition (second adjacent spacing condition) for eliminating the noise errors of the error nets has been registered. However, an increase amount of the distance between the nets or the number of grids between the nets of the minimum adjacent spacing condition used in the first wiring process can be also registered.

Figure 5A:
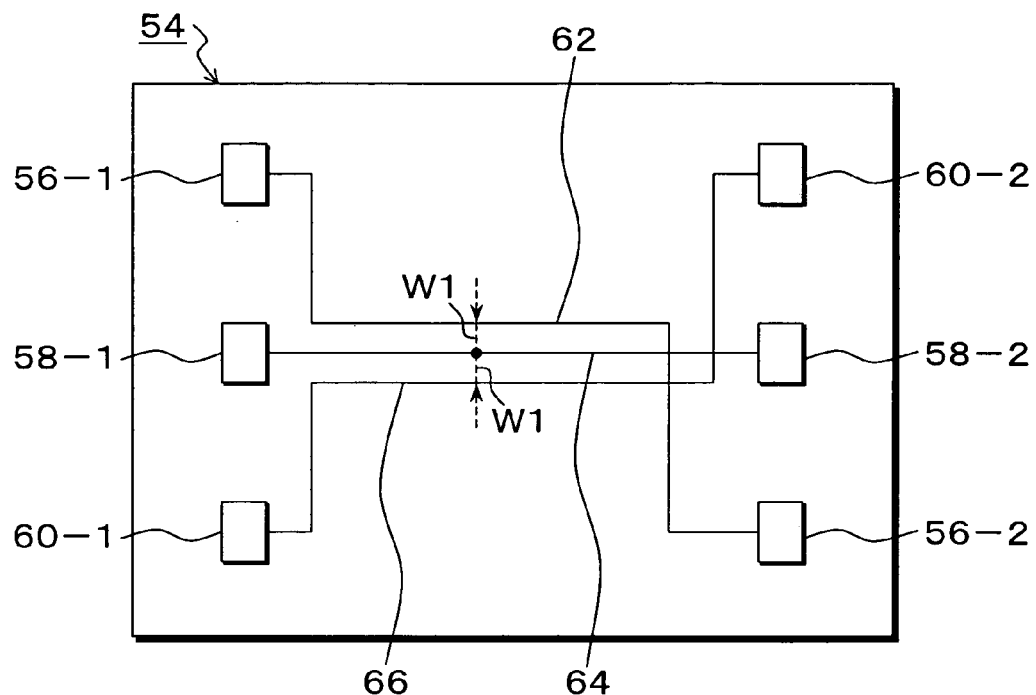
FIGS. 5A and 5B are explanatory diagrams of a wiring process for eliminating error nets according to the invention.
Figure 5B:
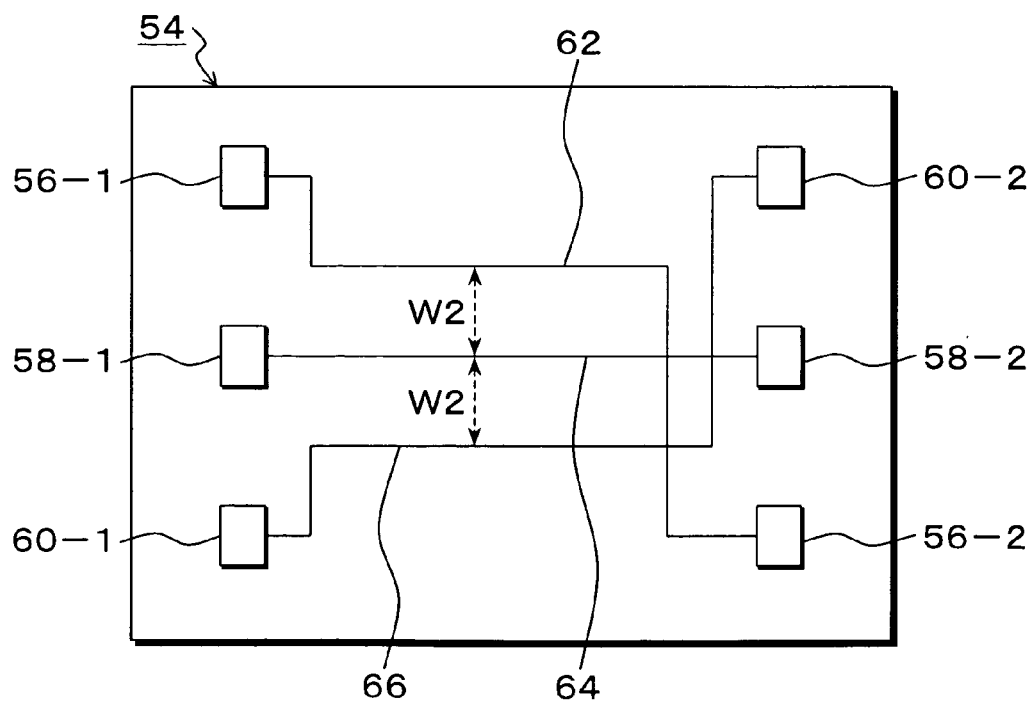

FIGS. 5A and 5B are explanatory diagrams of the wiring process for eliminating the error nets according to the invention. FIG. 5A shows a wiring result obtained by executing the wiring process by giving a distance W1 between the nets according to the minimum adjacent spacing condition as a default. In the first wiring result, a net 62 is arranged between cells 56-1 and 56-2 arranged in a chip 54, a net 64 is wired between cells 58-1 and 58-2, and a net 66 is wired between cells 60-1 and 60-2. The diagram shows a perspective view of a construction in which crossing portions of the nets 62, 64, and 66 are arranged in the different wiring layers and the wiring layers are connected by through holes. When the noise analysis is performed with respect to the wiring result of FIG. 5A as mentioned above, if the lengths of the three nets 62, 64, and 66 arranged in parallel exceed a certain value, the noise restricting condition is not satisfied. The nets 62, 64, and 66 are determined to be the error nets in which the error noises due to the crosstalks occur.

The net in which the noise error due to the crosstalks actually occurs is the net that is adjacent to the net which becomes a cause of the noises. For example, when the net 64 becomes a noise signal source, the adjacent nets 62 and 66 becomes the error nets in which the noise error due to the crosstalks is caused. A relation between the signal sources in the nets 62, 64, and 66 and the error nets in which the noise error due to the crosstalks is caused is a relative relation.

If the error nets 62, 64, and 66 are analyzed and extracted by the noise analysis for the wiring result of FIG. 5A, a parameter in which the adjacent spacing condition necessary to eliminate the noise errors, that is, the distance between the nets is set to W2 widened from the default W1 is formed and registered into the parameter file 34 shown in FIG. 2. After that, the adjacent spacing condition which gives the distance W2 between the nets registered in the parameter file 34 is given to the nets 62, 64, and 66 which were determined to be the error nets and the wiring process is executed again, so that the wiring result of FIG. 5B can be obtained. The noise analysis is performed with respect to the wiring result of FIG. 5B. If it is determined that the noise restriction is satisfied with respect to the nets 62, 64, and 66, the wiring process can be completed. Naturally, if the noise restriction is not satisfied with respect to the noise analysis of the wiring result of FIG. 5B and the nets are determined to be the error nets, an adjacent spacing condition is formed by using a larger distance W3 between the nets as a parameter and registered. It is given to the error nets again, the wiring process is executed, and the process is repeated until the distance between the nets reaches the allowable maximum value as an adjacent spacing condition.

Figure 6:
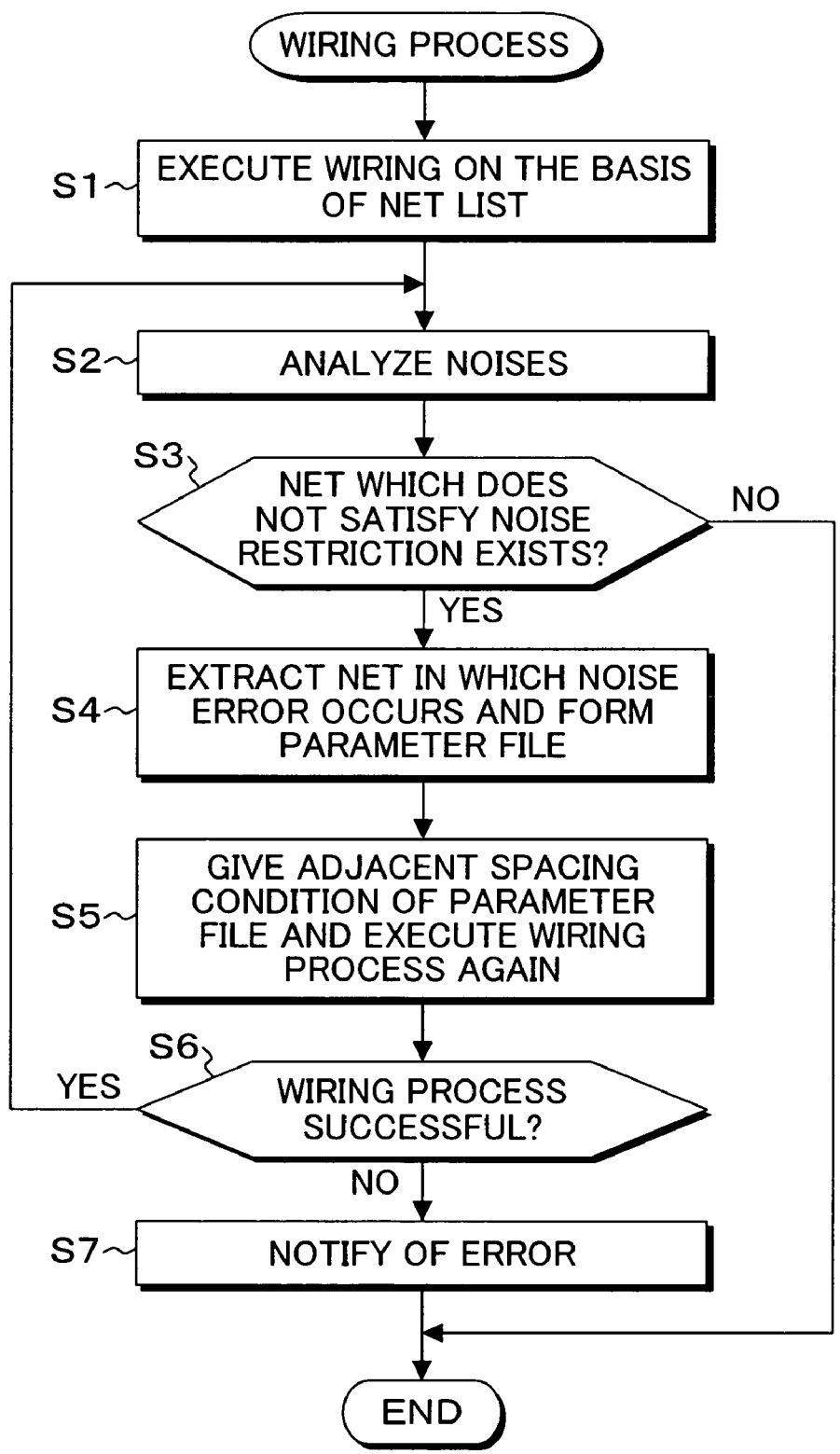
FIG. 6 is a flowchart for the wiring process according to the invention.

FIG. 6 is a flowchart for the wiring process according to the invention. In FIG. 6, the wiring process is executed on the basis of the net list 32 in step S1. In the first wiring process, the wiring process is executed by giving the minimum adjacent spacing condition. In next step S2, the noise analysis is performed with respect to the wiring result of step S1. In step S3, whether or not the nets which do not satisfy the noise restriction exist is discriminated. If the nets which do not satisfy the noise restriction exist, step S4 follows. The nets in which the noise errors have occurred are extracted. The adjacent spacing condition (second adjacent spacing condition) for eliminating the noise errors is formed and the parameter file 34 in which such a condition has been registered is formed. In step S5, the adjacent spacing condition in the parameter file is given to the error nets. With respect to the nets other than the error nets, the same minimum adjacent spacing condition as that in step S1 is given to them and the wiring process is executed again.

If the wiring process does not fail due to the lack of channels or the like but is successful in step S6, the processing routine is returned to step S2 and the noise analysis is performed. If the net which does not satisfy the noise restriction does not exist in step S3, this means that the wiring is successful, so that a series of processes is finished. If the wiring is unsuccessful due to the lack of channels in step S6, an error is notified in step S7 and the processing routine is finished. In this case, the processing routine is returned to the design stage on the upstream side and it is newly designed. In steps S2 to S6 in FIG. 6, the adjacent spacing condition is changed and the wiring process is repeated until the error nets which do not satisfy the noise restriction do not exist. However, actually, when the adjacent spacing condition reaches the maximum value, the processing routine is finished as an error.

The invention provides a wiring program which is used in the wiring process in the LSI designing system, and this wiring program is realized as a program having a processing procedure according to contents of the flowchart of FIG. 6.

The invention is not limited to the above embodiment but incorporates proper modifications without losing the objects and advantages of the present invention. The invention is not limited by the numerical values shown in the foregoing embodiment.

What is claimed is:

1. A wiring method comprising:
   a wiring processing step wherein a first adjacent spacing condition which does not become a wiring violation is given and a wiring process is executed on the basis of a net list of a semiconductor circuit;
   a noise analyzing step wherein error nets in which noise errors have occurred are extracted by analyzing noises of a wiring formed in said wiring processing step;
   a wiring condition changing step wherein a second adjacent spacing condition for eliminating the noise errors of the error nets extracted in said noise analyzing step is set;
   a re-wiring processing step wherein the second adjacent spacing condition is given to said error nets, said first adjacent spacing condition is given to nets other than said error nets, and the wiring process is executed again on the basis of said net list, wherein
   in said wiring condition changing step, a parameter file is prepared in which the second adjacent spacing condition is set having a different value according to the priority of a net type or a wiring layer, and
   in said re-wiring processing step, the second adjacent spacing condition of the parameter file is given to the error nets.

2. The wiring method according to claim 1, wherein in said wiring condition changing step, a parameter file in which a distance between the nets or the number of grids between the nets has been set as said second adjacent spacing condition of said error nets is formed.

3. The wiring method according to claim 1, wherein in said wiring processing step, a minimum adjacent spacing condition is given as said first adjacent spacing condition and the wiring process is executed.

4. A computer-readable storage medium which stores a wiring program for allowing a computer to execute:
   a wiring processing step wherein a first adjacent spacing condition which does not become a wiring violation is given and a wiring process is executed on the basis of a net list of a semiconductor circuit;
   a noise analyzing step wherein error nets in which noise errors have occurred are extracted by analyzing noises of a wiring formed in said wiring processing step;
   a wiring condition changing step wherein a second adjacent spacing condition for eliminating the noise errors of the error nets extracted in said noise analyzing step is set; and
   a re-wiring processing step wherein the second adjacent spacing condition is given to said error nets, said first adjacent spacing condition is given to nets other than said error nets, and the wiring process is executed again on the basis of said net list, wherein
   in said wiring condition changing step, a parameter file is prepared in which the second adjacent spacing condition is set having a different value according to the priority of a net type or a wiring layer, and
   in said re-wiring processing step, the second adjacent spacing condition of the parameter file is given to the error nets.

5. The computer readable storage medium according to claim 4, wherein in said wiring condition changing step, a parameter file in which a distance between the nets or the number of grids between the nets has been set as said second adjacent spacing condition of said error nets is formed.

6. The computer readable storage medium according to claim 4, wherein in said wiring processing step, a minimum adjacent spacing condition is given as said first adjacent spacing condition and the wiring process is executed.

7. A wiring apparatus comprising:
   a wiring processing unit which executes a wiring process by giving a first adjacent spacing condition that does not become a wiring violation on the basis of a net list of a semiconductor circuit;
   a noise analyzing unit which extracts error nets in which noise errors have occurred by analyzing noises of a wiring formed by said wiring processing unit; and
   a wiring condition changing unit which gives a second adjacent spacing condition for eliminating the noise errors to said error nets and allows said wiring processing unit to execute the wiring process again on the basis of said net list in the state where said first adjacent spacing condition has been given to nets other than said error nets wherein in said wiring condition changing step, a parameter file is prepared in which the second adjacent spacing condition is set having a different value according to the priority of a net type or a wiring layer, and
   in said re-wiring processing step, the second adjacent spacing condition of the parameter file is given to the error nets.

8. The wiring apparatus according to claim 7 wherein said wiring condition changing unit forms a parameter file in which a distance between the nets or the number of grids between the nets has been set as a second adjacent spacing condition of said error nets.

9. The wiring apparatus according to claim 7, wherein said wiring processing unit gives a minimum adjacent spacing condition as said first adjacent spacing condition and executes the wiring process.

* * * * *

UNITED STATES PATENT AND TRADEMARK OFFICE
CERTIFICATE OF CORRECTION

PATENT NO. : 7,325,218 B2  Page 1 of 1
APPLICATION NO. : 11/062617
DATED : January 29, 2008
INVENTOR(S) : Hideaki Katagiri It is certified that error appears in the above-identified patent and that said Letters Patent is hereby corrected as shown below:

Col. 10, line 24, delete "computer readable" and insert --computer-readable--, therefor.

Col. 10, line 29, delete "computer readable" and insert --computer-readable--, therefor.

Col.10, line 47, after "nets" insert --,--.

Signed and Sealed this

Twenty-fourth Day of June, 2008

JON W. DUDAS
*Director of the United States Patent and Trademark Office*